US 8,495,533 B2

(12) United States Patent
Drasny et al.

(10) Patent No.: US 8,495,533 B2
(45) Date of Patent: Jul. 23, 2013

(54) SYNTHESIZING VHDL MULTIPLE WAIT BEHAVIORAL FSMS INTO RT LEVEL FSMS BY PREPROCESSING

(75) Inventors: Gabor Drasny, Poughkeepsie, NY (US); Gabor Bobok, Schenectady, NY (US); Ali El-Zein, Autin, TX (US)

(73) Assignee: International Business Machines Corporation, Armonk, NY (US)

( * ) Notice: Subject to any disclaimer, the term of this patent is extended or adjusted under 35 U.S.C. 154(b) by 1826 days.

(21) Appl. No.: 11/522,036

(22) Filed: Sep. 16, 2006

(65) Prior Publication Data

US 2008/0127126 A1    May 29, 2008

(51) Int. Cl.
*G06F 17/50* (2006.01)
(52) U.S. Cl.
USPC .......................................................... 716/104
(58) Field of Classification Search
USPC .................. 716/103, 104; 717/135, 136, 137
See application file for complete search history.

(56) References Cited

U.S. PATENT DOCUMENTS

| | | | |
|---|---|---|---|
| 5,623,418 | A | 4/1997 | Rostoker et al. |
| 5,764,951 | A | 6/1998 | Ly et al. |
| 5,930,148 | A | 7/1999 | Bjorksten et al. |
| 6,173,435 | B1 | 1/2001 | Dupenloup |
| 6,263,483 | B1 | 7/2001 | Dupenloup |
| 6,339,837 | B1 | 1/2002 | Li |
| 6,357,013 | B1 * | 3/2002 | Kelly et al. ................... 713/324 |
| 6,415,420 | B1 | 7/2002 | Cheng et al. |
| 6,421,818 | B1 | 7/2002 | Dupenloup et al. |
| 6,691,079 | B1 | 2/2004 | Lai et al. |
| 6,697,773 | B1 | 2/2004 | Karchmer et al. |
| 6,792,580 | B2 | 9/2004 | Kawakatsu |
| 6,836,877 | B1 | 12/2004 | Dupenloup |

FOREIGN PATENT DOCUMENTS

JP        2000113023 A      4/2000

* cited by examiner

*Primary Examiner* — Vuthe Siek
(74) *Attorney, Agent, or Firm* — John E. Campbell; Ido Tuchman

(57) ABSTRACT

Preprocessing parallel sequences of "wait" statements and synthesizing these multiple "wait" statements to construct support for RTL tools. This is accomplished by preprocessing a VHDL process with multiple wait statements (referred to as BehFSM) into an equivalent register transfer.

17 Claims, 2 Drawing Sheets

SYNTHESIZING VHDL MULTIPLE WAIT BEHAVIORAL FSMS INTO RT LEVEL FSMS BY PREPROCESSING

BACKGROUND

1. Field of the Invention

The invention relates to Hardware Design Language tools for the design of circuit components and determining the performance and logical correctness of the designed circuit components. Hardware Design Languages and Hardware Design Language tools transform high-level designs (e.g., functional specifications or functional-level logic such as Boolean expressions, truth tables, or standard macro logic) into its hardware implementation, and model the target system to predict its performance and analyze its behavior.

2. Background Art

Tools for translating Hardware Description Languages (HDL) to gate level circuits are either behavioral or at the Register Transfer Level (RTL). These tools are deployed either for logic synthesis or cycle accurate simulation (software cycle simulators, accelerators, emulators, etc). For RTL tools, the architecture of the design is explicitly coded in the input HDL description, for example, an FSM is usually coded as a case statement, where the case choices are the states and the state transitions and other statements executions are described in the choice actions. For behavioral designs, the architecture is implicitly coded in the input HDL. One of the examples of behavioral constructs is the usage of multiple wait statements that can be embedded in control constructs ("if" and "case" statements) or loop constructs ("for" and "while" loops). Adding multiple wait support to RTL tools complicate the internal data structures and processing algorithms of these tools to an extent that these tools were not designed to perform such tasks. Thus, a clear need exist for methods and systems for preprocessing the multiple wait statements and synthesizing the multiple "wait" statements into constructs already supported by RTL tools.

SUMMARY OF THE INVENTION

By the methods and systems described herein for preprocessing parallel sequences of "wait" statements and synthesizing these multiple "wait" statements it is possible to construct support for RTL tools. This is accomplished by preprocessing a VHDL process model, or a Verilog process model, with multiple wait statements (referred to as BehFSM) into an equivalent register transfer RT level FSM (referred to as RTLFSM). Because this is a preprocessing step, there is no need to change the internal data structures of the RTL tool. These RTL tools can remain simple and straightforward. The method and system described herein further include the extraction of the states and state transitions as well the initial state. To make it simple to visualize, the equivalent RTLFSM is illustrated in VHDL, although the method may be practiced with Verilog.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
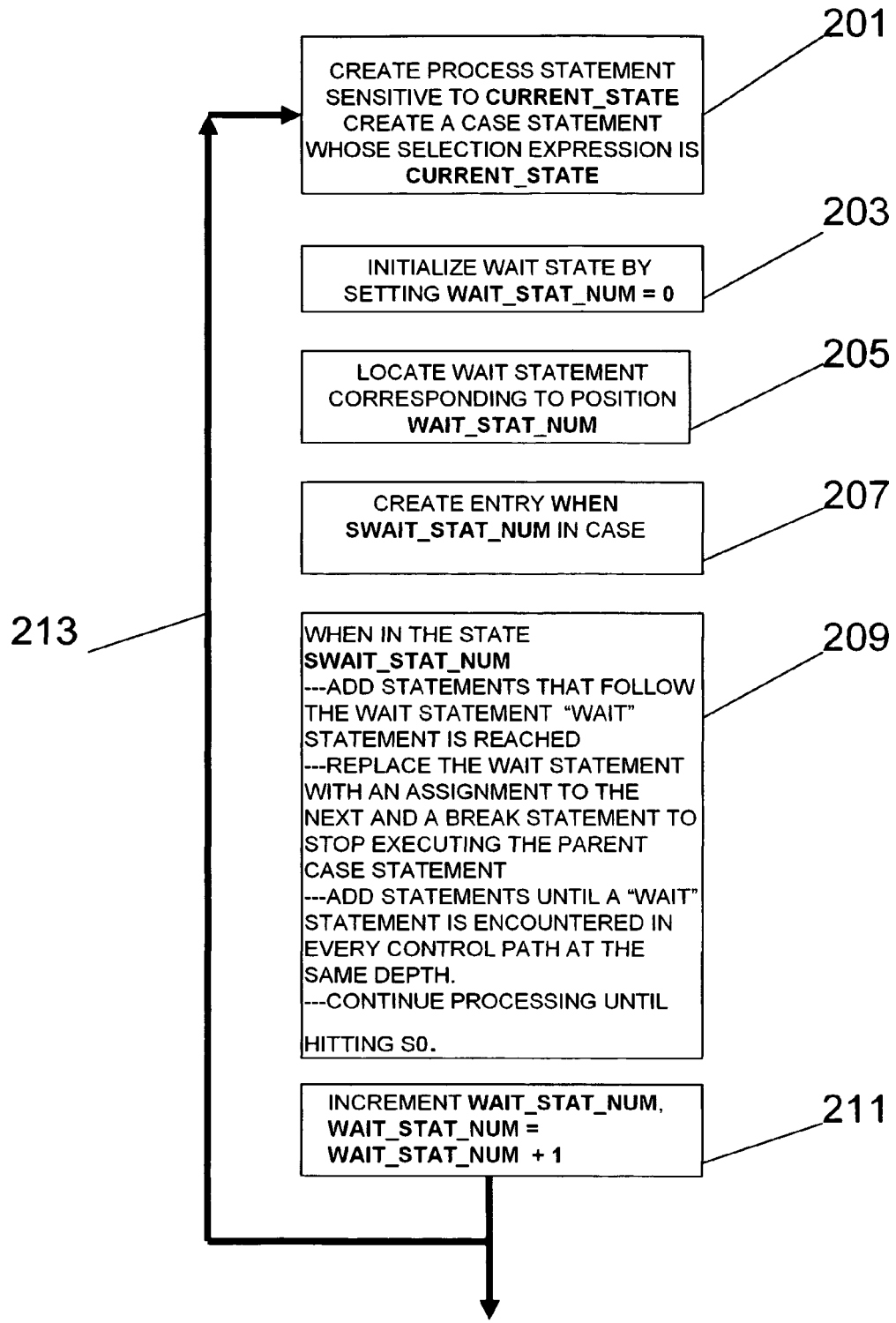
FIG. 1 illustrates a more detailed flow chart of preprocessing sequences of "wait" statements and synthesizing these multiple "wait" statements to construct support for RTL tools

The preprocessing method, system, and program product of the invention is illustrated by an example. Consider the following VHDL code as a starting point. This code is seen to establish and process "wait" states. As is well understood, these "wait states" represent transitions from the current state to the next state of the system on the positive edge of a clock.

```
process FSM
begin
    A <= B;
    wait until clk'event and clk = '1'; -- S0
    if (Enable1 ='1') then
        A <= E;
        C <= F;
        wait until clk'event and clk ='1'; -- S1
    else
        A <= E1;
        C <= F1;
        wait until clk'event and clk = '1'; -- S2
        C <= G;
    end if;
    if (Enable2 = '1') then
        A <=M;
    Else
        A <= N;
        C <= Q;
        wait until clk'event and clk ='1'; -- S3
    end if;
    C <= P;
end process;
``` for multiple wait statements (BehFSM) and register transfer level wait statements (RTLFSM) to be equivalent, both state machines must have 1. The same number of states and same transition functions.
2. The same initial states.

First we will describe the RTLFSM construction dealing with the states and states transition and later will describe seeding the RTLFSM in the same initial state as the BehFSM. Every wait statement, starting from top to bottom is labeled as Si, where i is the order in which the wait statement is encountered in the process starting with 0 and ending up with (number of wait statements−1). In the example above, the number of wait statements is 4. An enum type is declared as follows:

type statetype is enum (S0, S1, S2, S3);

Two signals, current_state, and next_state, representing the current state and expected next state are declared of type statetype:

signal current_state, next_state: statetype;

The relation between these two signals is given by the following equivalent VHDL process:

```
process next_state_fsm(clk)
begin
    if (clk'event and clk = '1') then
        current_state <=next_state;
    end if;
end process;
```

On every positive edge of the clock, the RTLFSM transit to the next expected state. The next_state is inferred as follows:
1. Create a process statement that is sensitive to current_state and create a case statement whose selection expression is current_state.
2. Initialize the wait state by setting wait_stat_num=0.
3. Locate the wait statement corresponding to position wait_stat_num.
4. Create an entry "when Swait_stat_num" in the case statement that corresponds to the behavioral model when the RTLFSM is in the state Swait_stat_num.

The action to be carried out when in the state Swait_stat_num is as follows:
a). start adding the statements that follow the wait statement to the action part until you hit a wait statement, no matter how deep in the control statement bodies (if statements, case statements, etc).
b). Replace the wait statement with two statements, an assignment to the next state with the right hand side being the state assigned to the encountered wait statement, and a break statement to stop executing the parent case statement controlled with the current_state created in step 1.
c) Keep adding statements until a "wait" statement is encountered in every control path at the same depth.
  i). A process statement with no sensitivity list acts as an infinite loop, so when reaching the end, the processing continues from the beginning of the process. S1 and S2 are at the same depth.
  ii). While processing S0, the processing stops when hitting S1 and S2.
  iii). However on the other hand hitting S3 will not stop processing since there is no wait statement at the same depth level.
  iv). Processing should continue until hitting S0.
  v). This is not a limitation assuming that a wait statement will encountered in every control path, because otherwise, there is a control path in the process statement that has no wait statement and the process will loop forever.
d). When finishing processing the statements after a wait statement that are at the same level, continue with the statements that are one level above that. For example, after processing the statements that are at the same level as S1 (none for this case), start processing with "if (Enable2='1')".
5. wait_stat_num is incremented, wait_stat_num=wait_stat_num+1.
6. Repeat steps 2 through 5 until wait_stat_num equals the number of wait statement.

Applying the above algorithm results in the following equivalent RTLFSM:

```
process FSM(current_state)
begin
    case current_state is
        when S0 =>
            if (Enable1 = '1')
        then
                A <= E;   C <= F;   next_state <= S1;
        break; -- not required, with simple analysis it can be removed
        else
                A <= E1;
                C <= F1;
                next_state <= S2;
        break; -- not required, with simple analysis it can be removed
            end if;
        when S1 =>
            if (Enable2 = '1') then
                A <= M;
```

-continued

```
        Else
                A <= N;
                C <= Q;
                next_state <= S3;
    break;
            end if;
            C <= P;
            A <= B;
            next_state <= S0;
        when S2 =>
            C <= G;
            if (Enable2 = '1') then
                A <=M;
            else
                A <= N;
                C <= Q;
                next_state <=S3;
                break;
            end if;
            C <= P;
            A <= B;
    next_state <= S0;
        when S3 =>
            C <= P;
            A <= B;
                    next_state <= S0;
    end case;
end process;
```

Going back to the BehFSM, it can be seen that initially, at time zero, only the statement A<=B should execute and the next state should be S0. There is not a state in the RTLFSM that mimics this behavioral. S3 comes close, but it is also executing C<=P. The initial state is, in general, a state different than any of the states in the RTLFSM. The initial statement can be easily determined by replacing every wait statement in the BehFSM by two statements: (a) an assignment to the next state out of the initial state, whose value is given by the state assigned to the encountered wait statement, and (b) a break statement. It is possible to stop when in every branch of the control a wait statement is encountered. For the BehFSM above The initial state is given by the following:

```
process FSM_initial
begin A <= B;
        next_state <= S0;
end process;
```

For the following BehFSM, the initial state is given by:

```
process FSM
begin
        if (Enable2 = '1') then
            A <= M;
        Else
            A <= N;
            C <=Q;
            wait until clk'event and clk = '1'; -- S0
        end if;
        A <= B;
        If (Enable1 = '1') then
            A <= E;
            C <= F;
            wait until clk'event and clk = '1'; -- S1
        else
            A <= E1;
            C <= F1;
            wait until clk'event and clk = '1'; -- S2
            C <= G;
        end if;
end process;
```

The resulting initial state is:

```
process FSM
  begin if (Enable2 = '1') then
    A <= M;
  Else
    A <= N;
    C <= Q;
    next_state <= S0; -- S0
  end if;
  A <= B;
  if (Enable1 = '1') then
    A <= E;
    C <= F;
    next_state <= S1; -- S1
  else
    A <= E1;
    C <= F1;
    next_state <= S2; -- S2
  end if;
end process;
```

Figure 2:
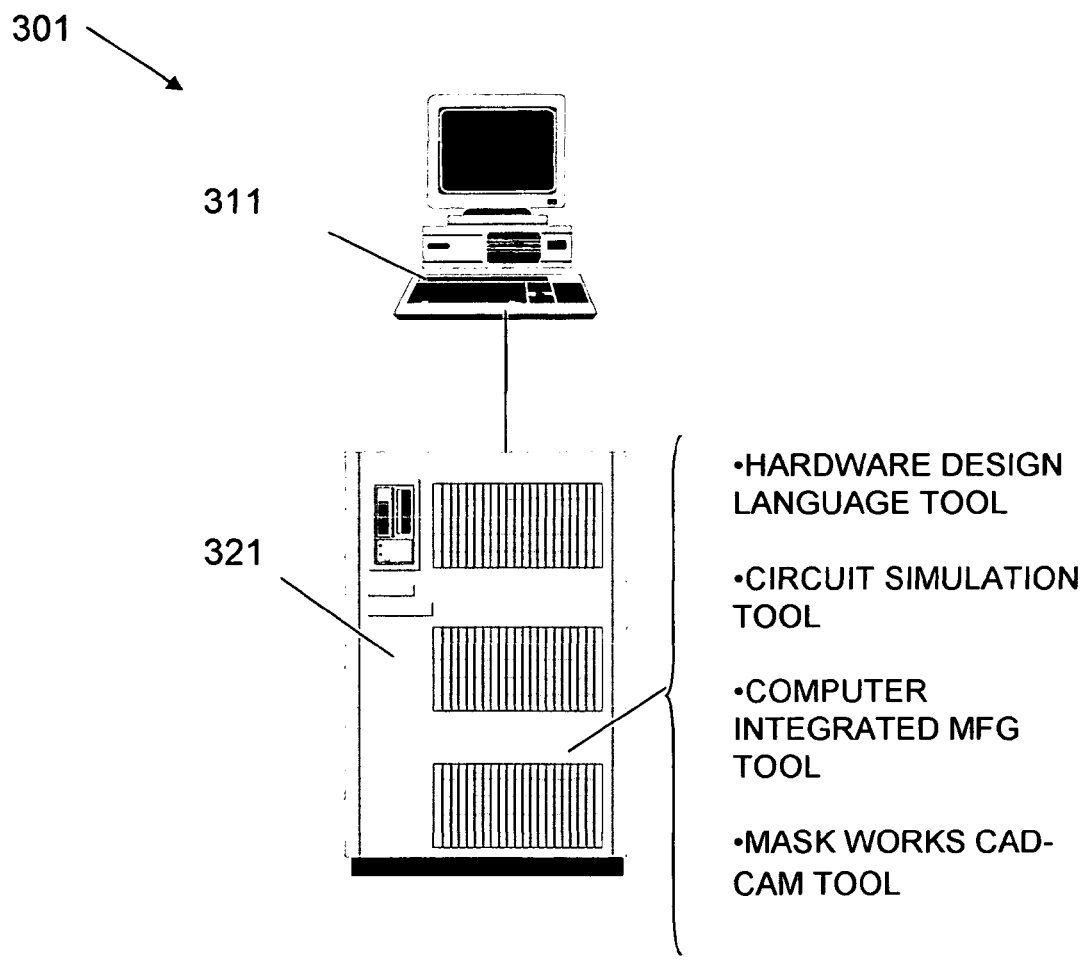
FIG. 2 illustrates a simplified diagram of the components of a design system including a user terminal and a server.

FIGS. 1 and 2 illustrate flow charts of the methods of the invention for preprocessing parallel sequences of "wait" statements and synthesizing these multiple "wait" statements it is possible to construct support for RTL tools. This is accomplished by preprocessing a VHDL process with multiple wait statements (referred to as BehFSM) into an equivalent register transfer RT level FSM (referred to as RTLFSM).

FIG. 1 illustrates a more detailed view of the a more detailed flow chart of to preprocess parallel sequences of "wait" statements and synthesizing these multiple "wait" statements to construct support for RTL tools. Block 201 shows the step of creating a process statement sensitive to current_state and creating a case statement whose selection expression is current_state. The next step, block 203, is initializing the wait state by setting wait_stat_num=0, and locating the wait statement corresponding to position wait_stat_num, 205.

The next step shown in FIG. 1, block 207, is creating an entry "when Swait_stat_num" in the case statement. This corresponds to the behavioral model when the RTLFSM is in the state Swait_stat_num.

The step shown in block 209 is a multi-sub process carried out when in the state Swait_stat_num. The sub-process steps are as follows:
a). Adding statements that follow the wait statement to the action part until a "wait" statement is reached; (if statements, case statements, etc).
b). Replace the wait statement with two statements, an assignment to the next state with the right hand side being the state assigned to the encountered wait statement, and a break statement to stop executing the parent case statement controlled with the current_state created in step 1 (Block 201).
c) Add statements until a "wait" statement is encountered in every control path at the same depth. Processing should continue until hitting S0.
d). When finishing processing the statements after a wait statement that are at the same level, continue with the statements that are one level above that As shown in block 211, wait_stat_num is incremented, wait_stat_num=wait_stat_num+1.

Return and repeat the above steps, 201-211, until wait_stat_num equals the number of the wait statement, as shown by the return loop 213.

FIG. 2 illustrates one example of a system for practicing the method of the invention using the program product of the invention. The system 301 includes a user terminal 311, e.g., a work station, and an associated server 321, which may be connected directly or over a network. The associated server includes tools and applications such as (by way of exemplification and not limitation) a Hardware Design Language Tool, a Circuit Simulation Tool, a Computer Integrated Mfg Tool, and a Mask Works CAD-CAM Tool.

Not shown are an operating system and system utilities, and links to associated equipment and fabrication tools may be included, The invention may be implemented, for example, by having the system for preprocessing parallel sequences of "wait" statements and synthesizing these multiple "wait" statements to construct support for RTL tools. This is accomplished by preprocessing a VHDL process with multiple wait statements (referred to as BehFSM) into an equivalent register transfer RT level FSM (referred to as RTLFSM), and executing the method as a software application, in a dedicated processor or set of processors, or in a dedicated processor or dedicated processors with dedicated code. The code executes a sequence of machine-readable instructions, which can also be referred to as code. These instructions may reside in various types of signal-bearing media. In this respect, one aspect of the present invention concerns a program product, comprising a signal-bearing medium or signal-bearing media tangibly embodying a program of machine-readable instructions executable by a digital processing apparatus to perform a method for by having the system . . . as a software application.

This signal-bearing medium may comprise, for example, memory in a server. The memory in the server may be non-volatile storage, a data disc, or even memory on a vendor server for downloading to a processor for installation. Alternatively, the instructions may be embodied in a signal-bearing medium such as the optical data storage disc. Alternatively, the instructions may be stored on any of a variety of machine-readable data storage mediums or media, which may include, for example, a "hard drive", a RAID array, a RAMAC, a magnetic data storage diskette (such as a floppy disk), magnetic tape, digital optical tape, RAM ROM, EPROM, EEPROM, flash memory, magneto-optical storage, paper punch cards, or any other suitable signal-bearing media including transmission media such as digital and/or analog communications links, which may be electrical, optical, and/or wireless. As an example, the machine-readable instructions may comprise software object code, compiled from a language such as "C++", Java, Pascal, ADA, assembler, and the like.

Additionally, the program code may, for example, be compressed, encrypted, or both, and may include executable code, script code and wizards for installation, as in Zip code and cab code. As used herein the term machine-readable instructions or code residing in or on signal-bearing media include all of the above means of delivery.

While the foregoing disclosure shows a number of illustrative embodiments of the invention, it will be apparent to those skilled in the art that various changes and modifications can be made herein without departing from the scope of the invention as defined by the appended claims. Furthermore, although elements of the invention may be described or claimed in the singular, the plural is contemplated unless limitation to the singular is explicitly stated.

We claim:

1. A method of preprocessing parallel sequences of "wait" statements and synthesizing these multiple "wait" statements in Hardware Design Language source code containing multiple wait statements into equivalent register transfer code target file with the target file being in lower to upper correct dependency order, comprising the steps of:

a) creating a process statement using a computer processor that is sensitive to a current state and creating a case statement whose selection expression is the current state;
b) initialize a wait state;
c) locating a wait statement corresponding in position to the initialized wait state;
d) creating an entry in a case statement in the code that corresponds to a behavioral model when a register transfer level wait state is in the initialized wait state; and
e) incrementing the wait state number.

2. The method of claim 1 comprising incrementing the wait state number to equal equals the number of wait statements in the target code.

3. The method of claim 1 wherein
the step of creating an entry in a case statement in the code that corresponds to a behavioral model when a register transfer level wait state is in the initialized wait state comprises
a) start adding the statements that follow the wait statement to the target code until the next wait statement;
b) replacing the wait statement an assignment to the next state and a break statement to stop executing the parent case statement controlled with the current state;
c) adding statements until a wait statement is encountered in every control path at the same depth;
d) after processing statements after a wait statement that are at the same level, processing statements that are one level above.

4. A computer system comprising a central processor, input means, output means, and memory, said computer system configured and controlled to carry out a method of preprocessing parallel sequences of "wait" statements and synthesizing these multiple "wait" statements in Hardware Design Language source code containing multiple wait statements into equivalent register transfer code target file, said method comprising the steps of:
a) creating a process statement that is sensitive to a current state and creating a case statement whose selection expression is the current state;
b) initialize a wait state;
c) locating a wait statement corresponding in position to the initialized wait state;
d) creating an entry in a case statement in the code that corresponds to a behavioral model when a register transfer level wait state is in the initialized wait state; and
e) incrementing the wait state number.

5. The computer system of claim 4 wherein the method comprises incrementing the wait state number to equal the number of wait statements in the target code.

6. The computer system of claim 4 wherein the step of creating an entry in a case statement in the code that corresponds to a behavioral model when a register transfer level wait state is in the initialized wait state comprises
a) start adding the statements that follow the wait statement to the target code until the next wait statement;
b) replacing the wait statement by an assignment to the next state and a break statement to stop executing the parent case statement controlled with the current state;
c) adding statements until a wait statement is encountered in every control path at the same depth;
d) after processing statements after a wait statement that are at the same level, processing statements that are one level.

7. A program product comprising non-transitory computer readable media having computer readable code thereon, said computer readable code adapted to control and configure a computer to perform a method comprising preprocessing parallel sequences of "wait" statements and synthesizing these multiple "wait" statements in Hardware Design Language source code containing multiple wait statements into equivalent register transfer code target file, comprising the steps of:
a) creating a process statement that is sensitive to a current state and creating a case statement whose selection expression is the current state;
b) initialize a wait state;
c) locating a wait statement corresponding in position to the initialized wait state;
d) creating an entry in a case statement in the code that corresponds to a behavioral model when a register transfer level wait state is in the initialized wait state; and
e) incrementing the wait state number.

8. The program product of claim 7 wherein the method comprises incrementing the wait state number equals to equal the number of wait statements in the target code.

9. The program product of claim 7 wherein the step of creating an entry in a case statement in the code that corresponds to a behavioral model when a register transfer level wait state is in the initialized wait state comprises
a) start adding the statements that follow the wait statement to the target code until the next wait statement;
b) replacing the wait statement an assignment to the next state and a break statement to stop executing the parent case statement controlled with the current state;
c) adding statements until a wait statement is encountered in every control path at the same depth;
d) after processing statements after a wait statement that are at the same level, processing statements that are one level.

10. The program product of claim 7 wherein the non-transitory computer readable media is on a vendor server for downloading to a processor for installation.

11. A method of simulating a computer processor using a Hardware Design Language to preprocess parallel sequences of "wait" statements and synthesizing these multiple "wait" statements in Hardware Design Language source code containing multiple wait statements into equivalent register transfer code target file with the target file being in lower to upper correct dependency order, comprising the steps of:
a) creating a process statement using a computer processor that is sensitive to a current state and creating a case statement whose selection expression is the current state;
b) initialize a wait state;
c) locating a wait statement corresponding in position to the initialized wait state;
d) creating an entry in a case statement in the code that corresponds to a behavioral model when a register transfer level wait state is in the initialized wait state;
e) incrementing the wait state number; and
f) recovering a processor simulation therefrom.

12. The method of claim 11 comprising incrementing the wait state number to equal the number of wait statements in the target code.

13. The method of claim 11 wherein the step of creating an entry in a case statement in the code that corresponds to a behavioral model when a register transfer level wait state is in the initialized wait state comprises
a) start adding the statements that follow the wait statement to the target code until the next wait statement;
b) replacing the wait statement an assignment to the next state and a break statement to stop executing the parent case statement controlled with the current state;

c) adding statements until a wait statement is encountered in every control path at the same depth;

d) after processing statements after a wait statement that are at the same level, processing statements that are one level above.

14. A method of simulating a computer processor using a Hardware Design Language to preprocess parallel sequences of "wait" statements and synthesizing these multiple "wait" statements in Hardware Design Language source code containing multiple wait statements into equivalent register transfer code target file with the target file being in lower to upper correct dependency order, comprising the steps of:

a) creating a process statement using a computer processor that is sensitive to a current state and creating a case statement whose selection expression is the current state;

b) initialize a wait state;

c) locating a wait statement corresponding in position to the initialized wait state;

d) creating an entry in a case statement in the code that corresponds to a behavioral model when a register transfer level wait state is in the initialized wait state comprising:

i) adding statements that follow the wait statement to the target code until the next wait statement;

ii) replacing the wait statement an assignment to the next state and a break statement to stop executing the parent case statement controlled with the current state;

iii) adding statements until a wait statement is encountered in every control path at the same depth; and iv) after processing statements after a wait statement that are at the same level, processing statements that are one level above;

e) incrementing the wait state number to equal the number of wait statements in the target code; and f) recovering a processor simulation therefrom.

15. A method of preprocessing parallel sequences of "wait" statements and synthesizing these multiple "wait" statements in Hardware Design Language source code containing multiple wait statements into equivalent register transfer code target file with the target file being in lower to upper correct dependency order, comprising the steps of:

a) creating a process statement using a computer processor that is sensitive to a current state and creating a case statement whose selection expression is the current state;

b) initializing a wait state;

c) locating a wait statement corresponding in position to the initialized wait state;

d) creating an entry in a case statement in the code that corresponds to a behavioral model when a register transfer level wait state is in the initialized wait state comprising: comprises:

i) adding the statements that follow the wait statement to the target code until the next wait statement;

ii) replacing the wait statement an assignment to the next state and a break statement to stop executing the parent case statement controlled with the current state;

iii) adding statements until a wait statement is encountered in every control path at the same depth; and iv) after processing statements after a wait statement that are at the same level, processing statements that are one level above; and e) incrementing the number of wait states to equal the number of wait statements in the target code.

16. A program product comprising non-transitory computer readable media having computer readable code thereon, said computer readable code adapted to control and configure a computer to perform a method comprising preprocessing parallel sequences of "wait" statements and synthesizing these multiple "wait" statements in Hardware Design Language source code containing multiple wait statements into equivalent register transfer code target file, comprising the steps of:

a) creating a process statement that is sensitive to a current state and creating a case statement whose selection expression is the current state;

b) initialize a wait state;

c) locating a wait statement corresponding in position to the initialized wait state;

d) creating an entry in a case statement in the code that corresponds to a behavioral model when a register transfer level wait state is in the initialized wait state comprising:

i) adding the statements that follow the wait statement to the target code until the next wait statement;

ii) replacing the wait statement an assignment to the next state and a break statement to stop executing the parent case statement controlled with the current state;

iii) adding statements until a wait statement is encountered in every control path at the same depth; and iv) after processing statements after a wait statement that are at the same level, processing statements that are one level above; and e) incrementing the wait state number to equal the number of wait statements in the target code.

17. The program product of claim 16 wherein the non-transitory computer readable media is on a vendor server for downloading to a processor for installation.

* * * * *